(12) United States Patent
Leung et al.

(10) Patent No.: US 10,128,771 B2
(45) Date of Patent: Nov. 13, 2018

(54) POWERING ELECTRICITY METER CIRCUIT FRONT END WITH CORELESS PCB TRANSFORMER

(71) Applicant: TEXAS INSTRUMENTS INCORPORATED, Dallas, TX (US)

(72) Inventors: Shun Kei Leung, Tsing Yi (HK); Stephen James Underwood, Lantau Island (HK)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/238,875

(22) Filed: Aug. 17, 2016

(65) Prior Publication Data
US 2018/0054138 A1 Feb. 22, 2018

(51) Int. Cl.
*G01R 15/18* (2006.01)
*H02M 7/06* (2006.01)
*H02J 50/10* (2016.01)
*H01F 27/28* (2006.01)
*H02J 5/00* (2016.01)

(52) U.S. Cl.
CPC ............ *H02M 7/06* (2013.01); *G01R 15/18* (2013.01); *H01F 27/2804* (2013.01); *H02J 5/005* (2013.01); *H02J 50/10* (2016.02)

(58) Field of Classification Search
USPC .............. 324/142, 107, 103 R, 76.11, 127; 702/60–61, 65
See application file for complete search history.

(56) References Cited

U.S. PATENT DOCUMENTS

| 2,651,723 | A | * | 9/1953 | Baker .................. H01J 49/022 250/295 |
| 5,307,008 | A | | 4/1994 | So |
| 7,174,261 | B2 | | 2/2007 | Gunn et al. |
| 8,767,867 | B1 | * | 7/2014 | Castor-Perry .......... H04L 27/12 363/21.1 |
| 2006/0133451 | A1 | * | 6/2006 | Birru ..................... H04B 1/713 375/130 |
| 2006/0192549 | A1 | | 8/2006 | Sandquist et al. |

(Continued)

FOREIGN PATENT DOCUMENTS

WO  WO2014/053187 A1  4/2014

OTHER PUBLICATIONS

Notification of Transmittal of the International Search Report and the Written Opinion of the International Searching Authority, or the Declaration in PCT/US 2017/047173, dated Nov. 23, 2017 (6 pages).

*Primary Examiner* — Patrick Assouad
*Assistant Examiner* — Demetrius Pretlow
(74) *Attorney, Agent, or Firm* — Michelle F. Murray; Charles A. Brill; Frank D. Cimino

(57) ABSTRACT

An apparatus. The apparatus includes a source of radio-frequency energy and a first transformer coil coupled to the source of RF energy. A second transformer coil, the second transformer coil electromagnetically coupled to the first transformer coil. A modulator is coupled to the source of radio frequency energy, wherein the modulator is configured to receive a modulating signal comprising a pseudorandom bit sequence. The apparatus further includes a power receiver coupled to the second transformer coil.

20 Claims, 9 Drawing Sheets

(56) References Cited

U.S. PATENT DOCUMENTS

| | | | |
|---|---|---|---|
| 2007/0035883 A1* | 2/2007 | Katcha | A61B 6/56 360/281.8 |
| 2016/0204616 A1* | 7/2016 | Liu | H02J 50/90 307/104 |
| 2017/0054313 A1* | 2/2017 | Harakawa | H02K 7/083 |

* cited by examiner

POWERING ELECTRICITY METER CIRCUIT FRONT END WITH CORELESS PCB TRANSFORMER

BACKGROUND

Existing utility grade electrical energy meters using isolated shunt resistor current sensors commonly use a conventional switched-mode power supply (SMPS) to power the isolated circuitry associated with the shunts. These SMPSes use either a ferrite-cored or an air-cored transformer. Ferrite-cored transformers can be magnetically saturated, making the meter susceptible to tampering from a powerful rare earth magnet placed on the outside of the case. Air-cored transformers are bulky, have low efficiency, and produce significant electromagnetic (EM) emissions, which must be contained by screening. Thus, there would be a benefit in the art to have a tamper-resistant power supply for isolated shunt circuitry that can also be low cost.

BRIEF DESCRIPTION OF THE DRAWINGS

For a detailed description of various examples, reference will now be made to the accompanying drawings in which.

NOMECLATURE AND DEFINITIONS

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

About" as used herein in conjunction with a numerical value shall mean the recited numerical value as may be determined accounting for generally accepted variation in measurement, manufacture and the like in the relevant industry.

DETAILED DESCRIPTION

Figure 1:
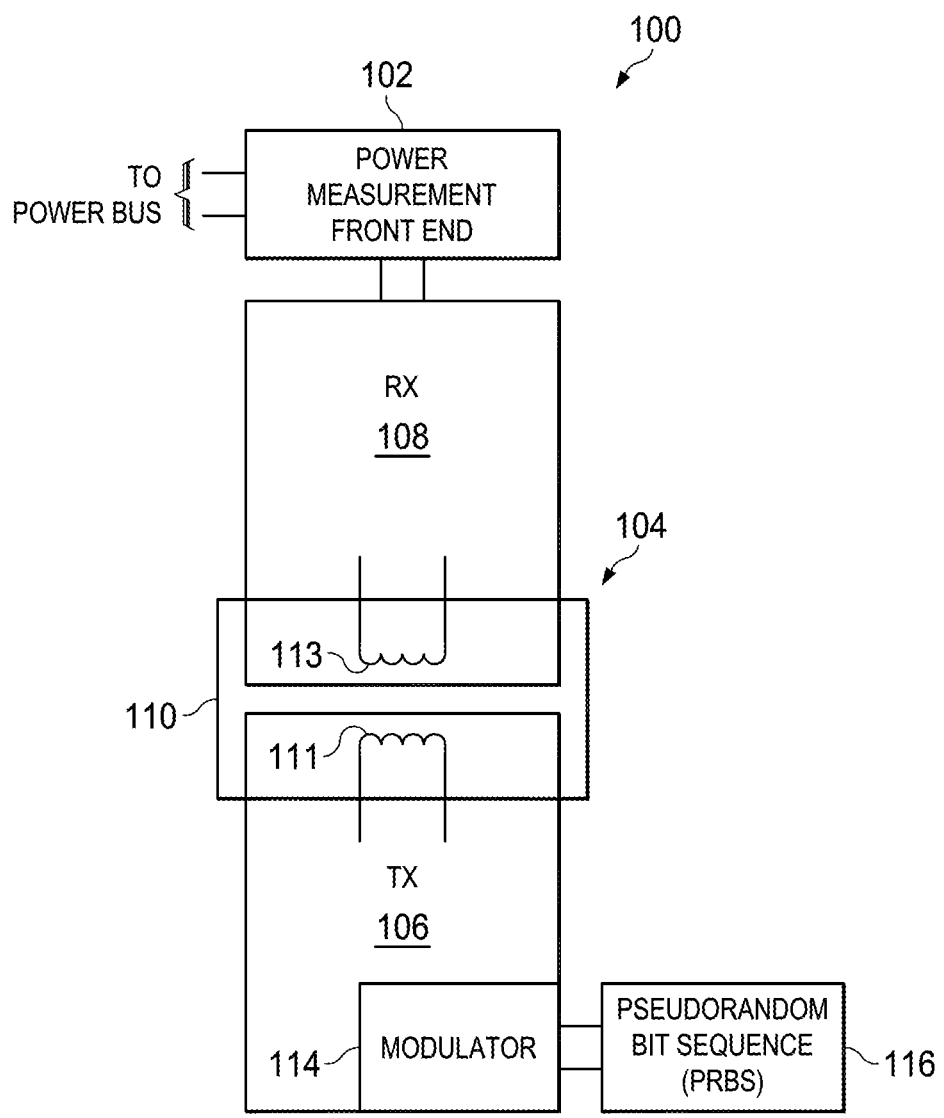
FIG. 1 shows a block diagram of a portion of a power meter circuit in accordance with various examples.

FIG. 1 shows a block diagram of a power meter circuit 100 in accordance with at least some embodiments. For ease of illustration, the power meter circuit 100 is shown as applied to a single phase of a power distribution system. For a three-phase power distribution system, portions of power meter circuit 100 are replicated, as described further below, to provide isolation of each phase of the system.

Power meter circuit 100 includes a power measurement front end 102 that is coupled to the power distribution bus (not shown in FIG. 1) and comprises electrical circuitry that senses the voltage on the bus and current flowing on the bus. Power measurement front end 102 may also include circuitry to digitize the sensed voltage and currents, and perform calculations to determine the instantaneous power flowing on the bus and other parameters associated therewith, such as the power factor and the like. Electrical power to the circuitry may be provided by an isolated power supply 104.

Power supply 104 includes a source of radio-frequency (RF) energy, power transmitter (TX) 106, electromagnetically coupled to a power receiver (RX) 108 via transformer 110. The RX 108 rectifies the RF energy and provides DC power to the power measurement front end 102 at output 112. Power supply 104 will be described in further detail below.

TX 106 includes a coil 111 that forms a primary coil of a transformer 110. A secondary coil, or coil, of transformer 110 may be provided by a coil 113. RX 108 may receive RF energy electromagnetically coupled into secondary coil 113. As would be appreciated by those skilled in the art having the benefit of the disclosure, in at least some embodiments, electromagnetic coupling may be predominantly by magnetic flux linkage between coils 111 and 113. Further, in at least some embodiments, coil 113 may be incorporated in RX 108. In at least some embodiments, transformer 110 may be a coreless transformer. Transformer 110 provides a galvanic isolation barrier for power supply 104.

TX 106 may also include a modulator 114. Modulator 114 may, in alternative embodiments be either a phase modulator or a frequency modulator that modulates the phase, or frequency, respectively of the RF energy generated by TX 106 with a modulating signal input to the modulator 114. In at least some embodiments of power meter circuit 100, the modulating signal may be a pseudorandom bit sequence (PRBS) 116. Modulating the RF energy from TX 106 by the PRBS 116 mitigates tampering with power meter circuit 100 by jamming the RF energy coupled into RX 108. The PRBS may be generated by any suitable mechanism. For example, a linear feedback shift register (LFSR) may be implemented in block 116. As would be appreciated by those skilled in the art with the benefit of the disclosure, no PRBS is, as the name implies, is not truly random. Rather, a PRBS is periodic, although the period, by design, may be long. Thus, in principle, a potential jammer with sufficient perseverance may be able to infer the periodicity and replicate the PRBS. Additional robustness of the tamper-resistance may be provided, in alternative embodiments, by, for example reseeding the LFSR, or using a PRBS generated using one-way functions such as cryptographic hash function for example, SHA-1 or a block cipher, such as the Advanced Encryption Standard (AES).

Figure 2:
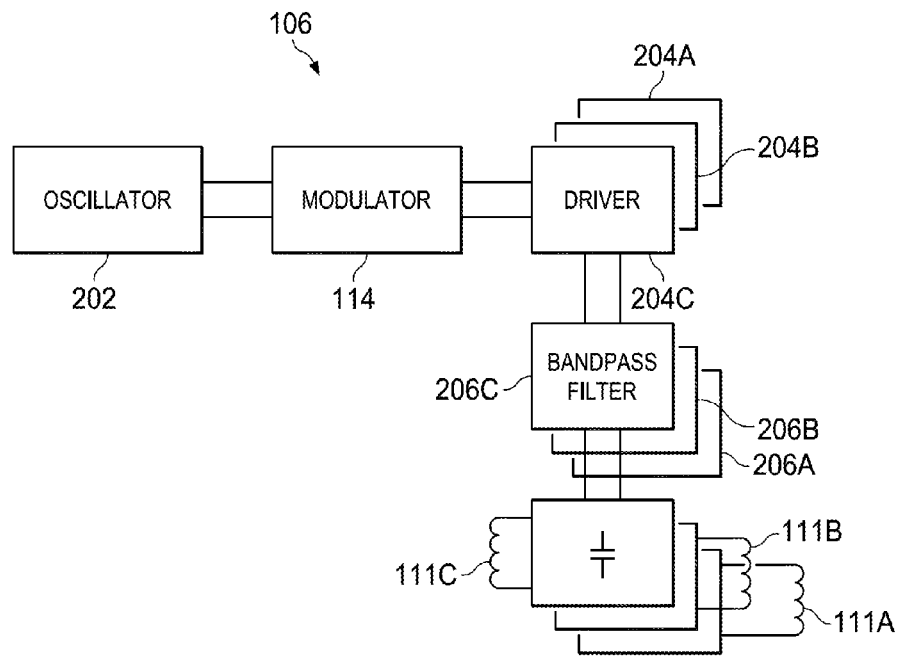
FIG. 2 shows a block diagram of a radio-frequency (RF) power transmitter in accordance with various examples.

Turning to FIG. 2, FIG. 2 shows a block diagram of a TX 106 in accordance with at least some embodiments. RF energy is generated by an oscillator 202. Oscillator 202 may have a frequency in the range from about 5 MHz to about 30 MHz. In at least some embodiments, a frequency of 13.56 MHz may be used. The radio frequency spectrum in the high frequency range (2 MHz-30MHz) is allocated to various services by International treaties, and, in general, use of radio frequencies in this range are subject to regulations which place significant restrictions on the emissions arising from unlicensed uses. Use of a frequency of 13.56 MHz, which lies within a designated industrial, scientific and medical (ISM) radio band, is convenient inasmuch as it reduces the need to control emissions from power transmitter 106. Oscillator 202 may, but need not, be a sinusoidal oscillator, and an exemplary embodiment using a digital logic gate generating a square wave output will be described below. The output of oscillator 202 is coupled to a modulator 114 which, as described above, may be a frequency modulator or, alternatively a phase modulator. An exemplary phase modulator based on a digital logic gate and the square wave output from oscillator 202 will also be described further below, in conjunction with FIG. 6.

The modulated RF energy from modulator 114 may be input to drivers 204A-C. Drivers 204A-C may be replicated to provide for isolated power for each of the three phases of a power distribution system, as previously described. Outputs of drivers 204A-C may be coupled to a corresponding one of bandpass filters 206A-C. In embodiments of TX 106 having an oscillator 202 with a non-sinusoidal output, bandpass filters 206A-C may be used to reduce the harmonic content of the RF energy provided to the primaries of transformer 110 (FIG. 1). The harmonic content of the RF energy may be further reduced by resonating the primary of transformer 110 with a shunt capacitors 208A-C in parallel with each of the primary coils 111A-C of a corresponding one of transformers 110 (not shown in FIG. 2). Stated otherwise, a primary coil 111 and a shunt capacitor 208 may form a resonant circuit at the frequency of the RF energy. Again shunt capacitors 208A-C may be replicated to provide for the three-phases of the power distribution system with the output of each of bandpass filters 206A-C coupled to a corresponding one of shunt capacitors 208A-C.

Figure 3:
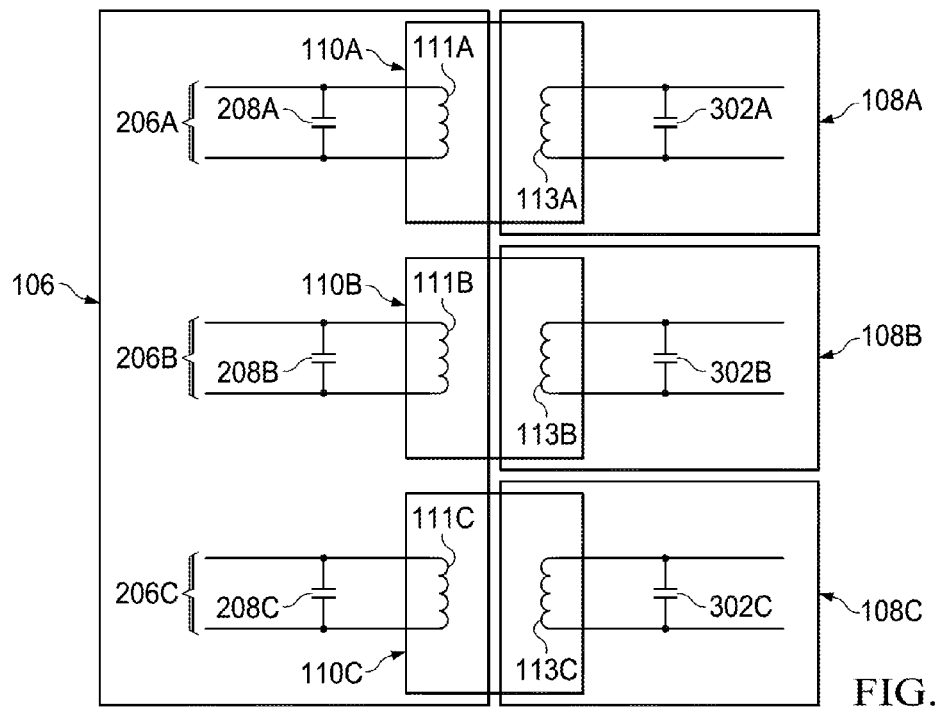
FIG. 3 shows a block diagram of a portion of an RF power transmitter and an RF power receiver in accordance with various examples.

Turning now to FIG. 3, portions of TX 106 and three replications, RX 108A-C of an RX 108 are shown. These include transformers 110A-C providing galvanic isolation for each of the phases of a three-phase power distribution system. Similar to shunt capacitors 208A-208C, each of the secondary coils 113A-C of the transformers 110A-C may have on of a capacitor 302A-C in parallel, to resonate each secondary coil 113A-C at the frequency of the RF energy from TX 106. Stated otherwise, similar to a coil 111 and capacitor 208, a coil 113 and a capacitor 302 may form a resonant circuit at the frequency of the rf energy.

Figure 4A:
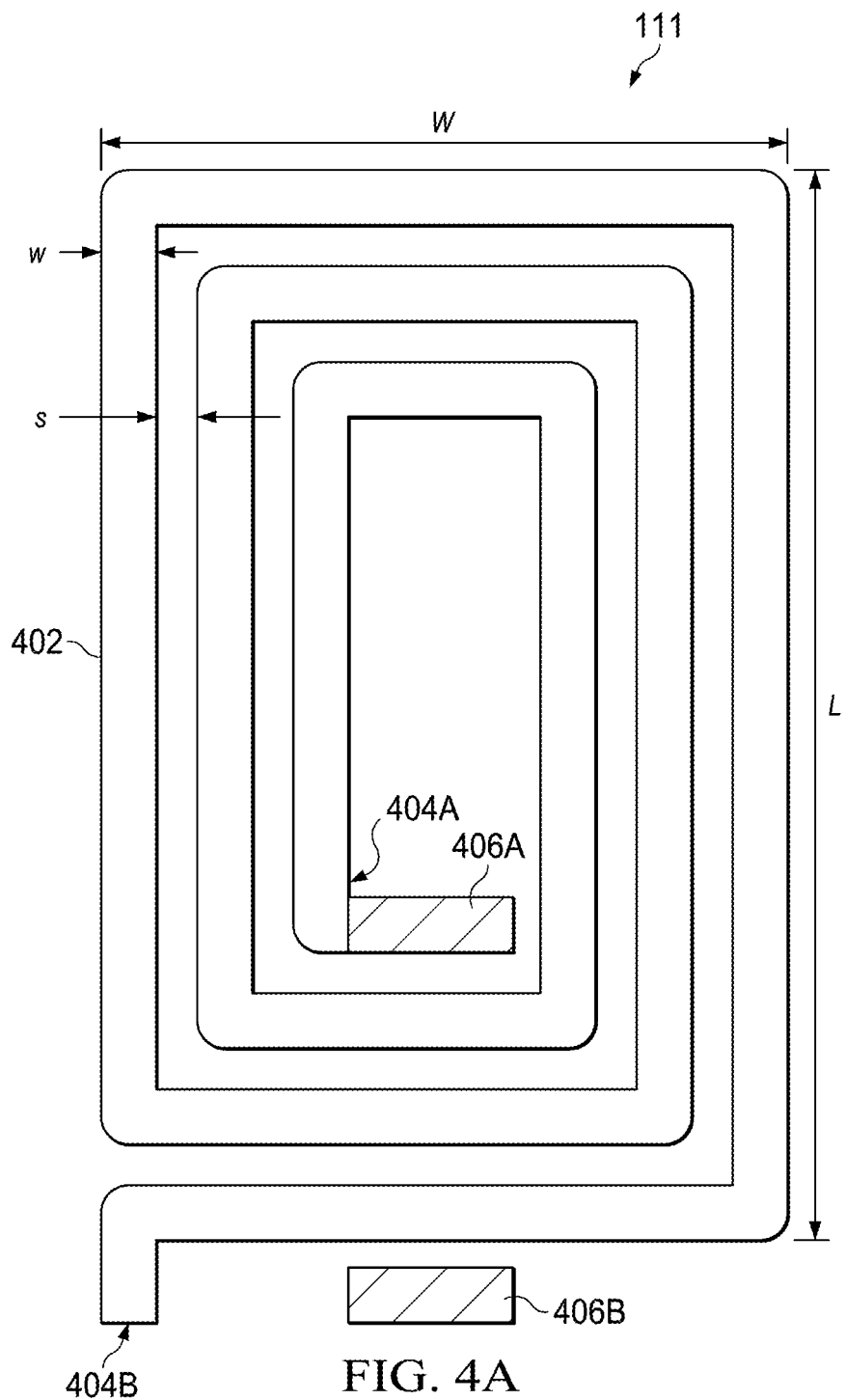
FIGS. 4A and 4B respectively show primary and secondary transformer coils in accordance with various examples.
Figure 4B:
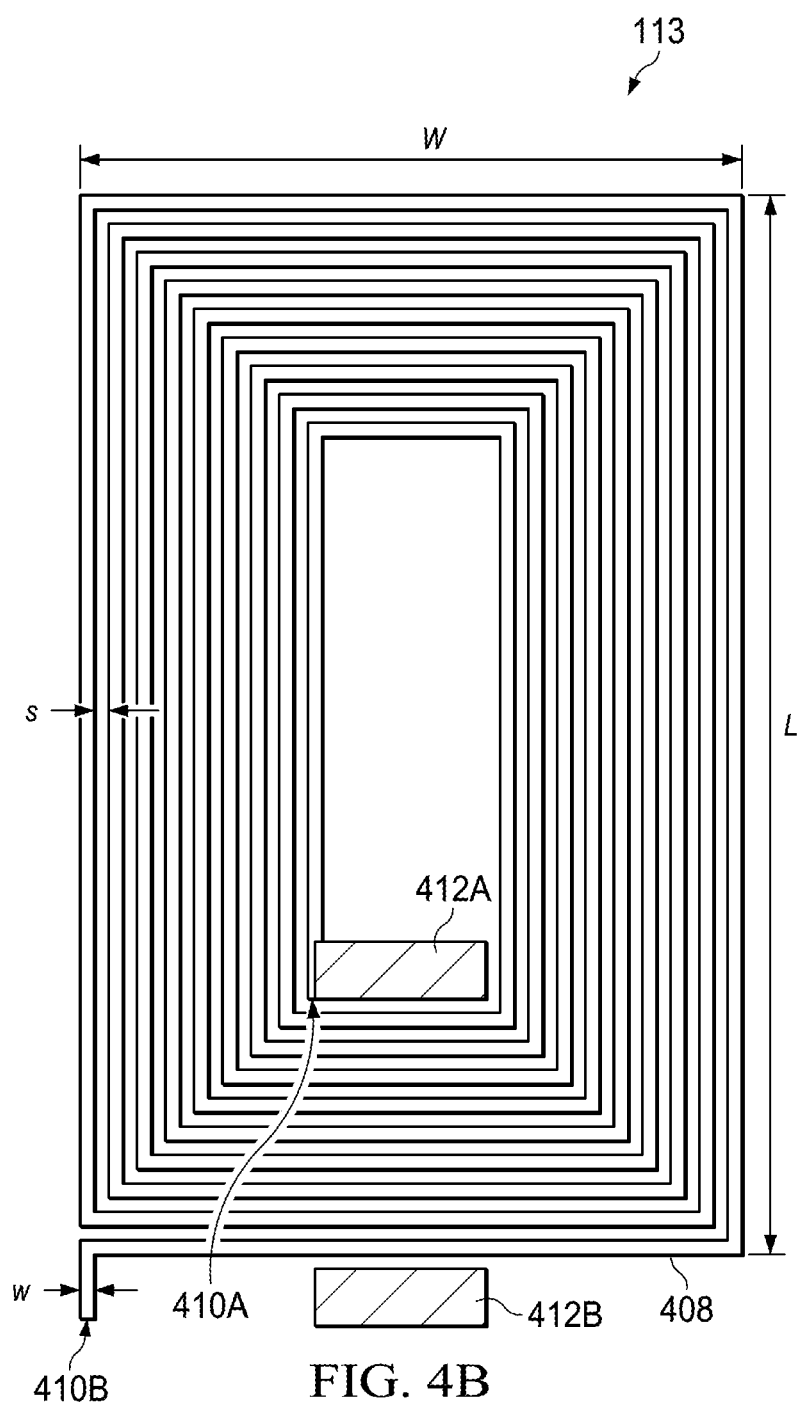

In at least some embodiments, a transformer 110 may comprise coils 111 and 113 formed from a spiral pattern etched on opposite sides of a double-sided printed circuit board. By way of example, suitable printed circuit boards include boards comprising FR-4 glass-epoxy material. However, it would be appreciated by those skilled in the art having the benefit of the disclosure that any PCB material having appropriate electrical breakdown and flame-resistant properties as dictated by the application to electric power meters may be suitable. FIG. 4A shows an exemplary embodiment of a coil 111, comprising a conductor having spiral pattern which may be etched on one side of a double-sided printed circuit board (PCB). Stated otherwise, the copper traces 402 form the "windings" of the coil 111. A second coil similarly formed and etched on the opposite side of the double-sided PCB forms the secondary coil 113 of the transformer 110, as shown in FIG. 4B and described further below. In at least some embodiments, the dimensions of coil 111 may be about: a trace width, w, of about 40 mils (thousandths of an inch); a spacing between traces, s, of about 20 mils; a length, L, of about 740 mils; and a width W, of about 460 mils.

Ends 404A and 404B of the spiral pattern of coil 111 form the terminals for coupling coil 111 to the remaining circuitry as described above. The two-sides of the PCB provide a galvanic isolation barrier. To maintain the integrity of the barrier which may be compromised by the formation of holes between the sides of the PCB, a pad 406A may be coupled to end 404A to provide an attachment for a first terminal of a zero-ohm SMD resistor (sometimes referred to as a zero ohm link) (not shown in FIG. 4A). A matching pad 406B provided an attachment point for a second terminal of the zero ohm resistor, and further provides a terminal for coupling coil 111 to the remaining circuitry of the TX 106. As would be appreciated by those skilled in the art having the benefit of the disclosure, a zero-ohm resistor, or zero-ohm link, does not necessarily have zero resistance. Rather, it need only have a resistance small compared to the impedance of the coil 111 at the frequency of the RF energy, for example, ten percent (10%), or less, of the coil impedance. In at least some other embodiments, a zero-ohm resistor may have a resistance less than about 0.1 ohm, in other embodiments a zero-ohm resistor may have a resistance equal to or less than 50 milliohms, and in still other embodiments equal to or less than 10 milliohms.

Likewise, in an embodiment as shown in FIG. 4B, coil 113 is formed from a spiral pattern etched on the side of the double-sided PCB opposite that of coil 111, FIG. 4A. Similarly to coil 111, copper traces 408 of the spiral pattern form the "windings" of coil 113. In at least some embodiments, the dimensions of coil 113 may be about: a trace width, w, of about 10 mils (thousandths of an inch); a spacing between traces, s, of about 10 mils; a length, L, of about 710 mils; and a width W, of about 430 mils. In at least some embodiments, the turns ratio of coils 111 and 113 need not be equal. For example, in the embodiments of coils 111 and 113 in FIGS. 4A, 4B, the turns ratio (primary to secondary) is 3:8.

Similar to coil 111, ends 410A and 410B of the spiral pattern of coil 113 form the terminals for coupling coil 113 to the remaining circuitry of RX 108 (not shown in FIG. 4B). Again to maintain the integrity of the galvanic isolation provided by the PCB, a pad 412A may be coupled to end 410A to provide an attachment for a first terminal of zero-ohm SMD resistor (not shown in FIG. 4B). A matching pad 412B provides an attachment point for a second terminal of the zero ohm resistor, and further provides a terminal for coupling coil 113 to the remaining circuitry of the RX 108.

Figure 5:
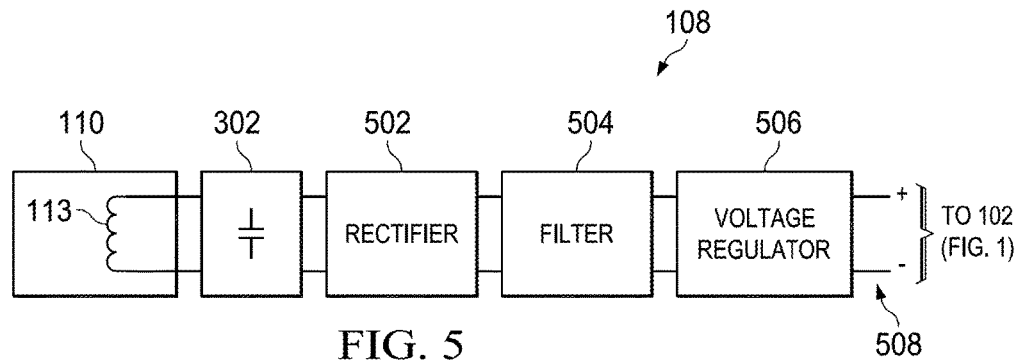
FIG. 5 shows a block diagram of an RF power receiver in accordance with various examples.

Referring now to FIG. 5, FIG. 5 shows a block diagram of an RX 108 in accordance with at least some embodiments. For isolation of a three-phase power distribution system, the RX 108 would be replicated in three instances, as previously described. RX 108 includes a secondary coil 113 of transformer 110 and a parallel capacitor 302, as described above. RX 108 further includes a rectifier 502 coupled to the secondary coil 113 and parallel capacitor 302. In at least some embodiments, rectifier 502 may be a full-wave bridge rectifier, as described further below in conjunction with FIG. 9. An output of rectifier 502 may be coupled to a filter 504 to smooth the rectified RF energy coupled to receiver 108 through transformer 110. In at least some embodiments, filter 504 may comprise a capacitor, also described further in conjunction with FIG. 9. The rectified and filtered DC may then be input to a voltage regulator circuit 506 that provides a regulated DC voltage output 508 to a power measurement front end 102 (FIG. 1) sensing one of the phases of the three-phase power distribution system.

Figure 6:
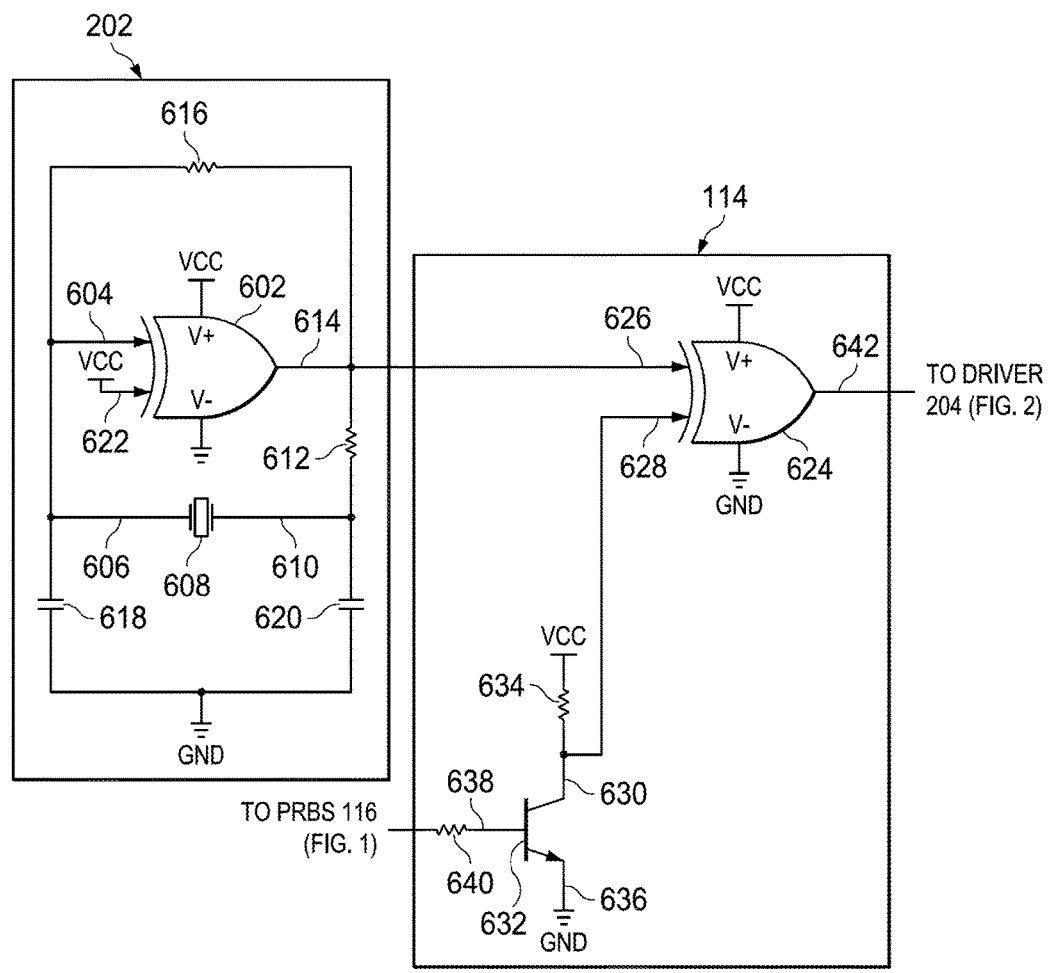
FIG. 6 shows a schematic drawing of an oscillator and modulator in accordance with various examples.

Turning to FIG. 6, a schematic diagram of an oscillator 202 and modulator 114 in accordance with at least some embodiments is shown. Oscillator 202 includes an exclusive-or (XOR) gate having one input 604 coupled to a first terminal 606 of a crystal 608. A second terminal 610 of crystal 608 is coupled via a resistor 612 to output 614 of XOR gate 602. The frequency of the RF output of oscillator 202 corresponds to a series-resonant frequency of crystal 608. In at least some embodiments, the frequency may be 13.56 Mhz. A resistor 616 may also be coupled between output 614 and input 604 of XOR gate 602. Capacitor 618 and 620 are coupled between the terminals 606 and 610 of crystal 608 and a ground. Power may be supplied to XOR gate 602 by a single-ended power supply (not shown in FIG. 6) supply defining a positive supply voltage (VCC) and a ground reference potential, or simply ground (GND). A second input 622 of XOR gate 602 is also tied to VCC. Exemplary values of the components of oscillator 202 which may be used in at least some embodiments are listed in Table 1:

TABLE 1

| Reference Number | Component | Value |
|---|---|---|
| 602 | XOR Gate | 74LVC02 |
| 612 | Resistor | 10K ohms |
| 616 | Resistor | 1 Megohm |
| 618 | Capacitor | 33 picofarads |
| 620 | Capacitor | 33 picofarads |

For the exemplary XOR gate 602, VCC may be from about 1.2 volts to about 3.6 volts. Considering now modulator 114, modulator 114 includes an XOR gate 624 having a first input 626 coupled to the output 614 of oscillator 202. A second input 628 is coupled to a collector 630 of a transistor 632. The collector 630 of transistor is also coupled to VCC through a resistor 634. Emitter 636 of transistor 632 is coupled to ground. To mitigate against tampering, as described above, base 638 of transistor 632 is driven by the PRBS generator (116, FIG. 1) through a resistor 640. Phase modulated RF energy is output at output 642 of XOR gate 624. The application of the pseudorandom phase modulation helps to provided tamper resistance. In the absence of modulation, a potential jammer may listen to the powering RF energy and phase synchronize and lock to it. The jammer may then generate a signal that is 180° out of phase, i.e., inverted, and by adjusting its magnitude, cancel out the powering RF energy, thereby starving the power measurement front end of electrical power. By XORing the output of the oscillator 202 with the pseudorandom bit sequence, the phase of the RF at the output of the XOR gate 624 will undergo 180° shifts in phase at what appear to be random times. Because, in the presence of the pseudorandom modulation, the phase of the powering RF energy shifts unpredictably, the ability of a potential jammer to lock onto the powering RF signal and generate an anti-phase signal is substantially diminished. An alternative embodiment based on a closed-loop approach which may be used to provide further mitigation against jamming is described in conjunction with FIG. 11 below. Exemplary values of the components of modulator 114 which may be used in at least some embodiments are listed in table 2:

TABLE 2

| Reference Number | Component | Value |
|---|---|---|
| 624 | XOR Gate | 74LVC02 |
| 632 | Transistor | MMBT3904 |
| 634 | Resistor | 100 kilohms |
| 640 | Resistor | 1 kilohm |

Figure 7:
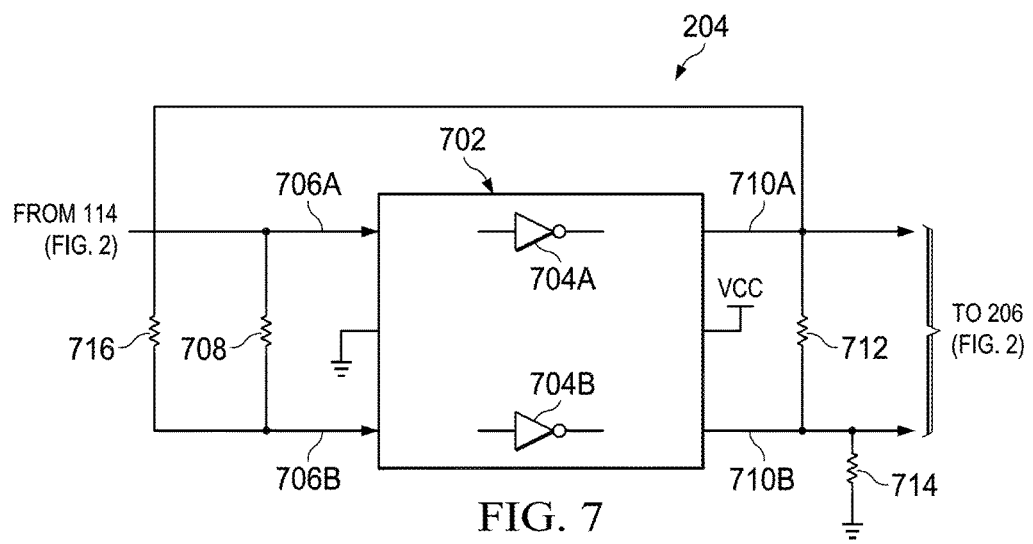
FIG. 7 shows a schematic drawing of a driver in accordance with various examples.

FIG. 7 shows a schematic of an exemplary driver 204 in accordance with at least some embodiments. Driver 204 may comprise an integrated circuit 702 including a pair of invertors 704A, 704B. Invertors 704A, 704B may be connected in parallel wherein the inputs 706A, 706B of invertors 704A, 704B, respectively, are strapped together. In at least some embodiments, inputs 706A, 706B may be strapped by a zero ohm resistor 708. Similarly outputs 710A, 710B of invertors 704A, 704B, respectively are strapped together. In at least some embodiments, outputs 710A, 710B may be strapped by a zero ohm resistor 712. Further, output 710B may be coupled to ground. In at least some embodiments, output 710B may be coupled to ground through a zero ohm resistor 714. Further, output 710A of inverter 704A may be coupled to input 706B of invertor 704B; in at least some embodiments, output 710A and input 706B may be coupled through a zero ohm resistor 716. A single-ended power supply defining a VCC and GND may also be used with driver 204. An exemplary integrated circuit 702 which may be used in at least some embodiments is a 74LVC2G04 dual inverter.

Figure 8:
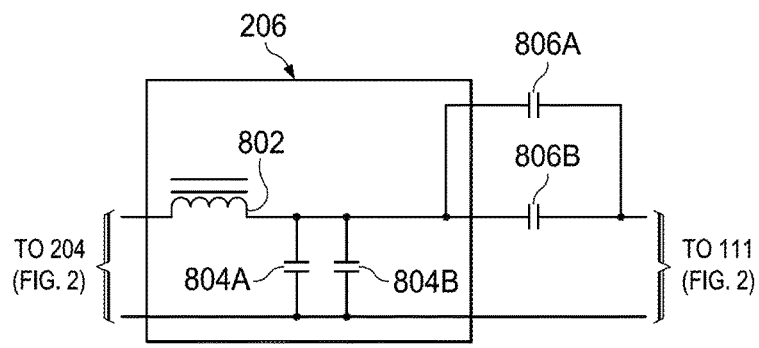
FIG. 8 shows a schematic drawing of a bandpass filter in accordance with various examples.

FIG. 8 shows a schematic of an exemplary bandpass filter 206 in accordance with at least some embodiments. Bandpass filter 206 includes a series inductor 802 and a shunt capacitance 804. In at least some embodiments, shunt capacitance 804 may comprise a pair of shunt capacitors 804A, 804B to provide granularity in setting the frequency of the bandpass filter 206. Exemplary values of inductor 802 and capacitors 804A, 804B in an embodiment based on an RF frequency of 13.65 MHz are 470 millihenries and 270 picofarads, respectively. Bandpass filter 206 may be AC coupled to the remaining circuitry of TX 106 via a coupling capacitance 806. In at least come embodiments, coupling capacitance 806 may comprise two or more parallel-connected capacitors 806A, 806B. Capacitors 806A, 806B each may have a value of about 0.1 microfarads in an embodiment based on an RF frequency of 13.56 MHz.

Figure 9:
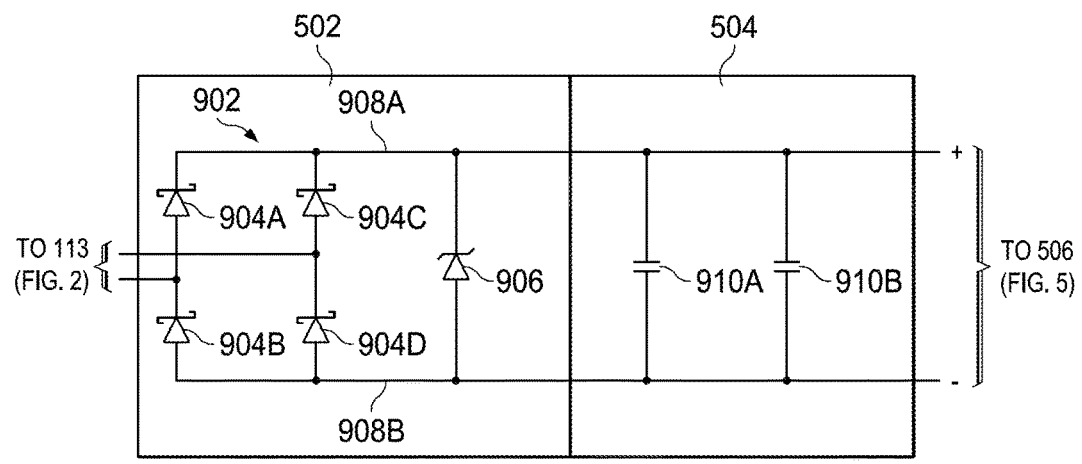
FIG. 9 shows a schematic drawing of a rectifier and filter in accordance with various examples.

Turning to exemplary embodiments of the components of a RX 108, FIG. 9 shows a schematic of a rectifier 502 and filter 504 in accordance with at least some embodiments. Rectifier 502 may be a bridge circuit 902 comprising four diodes 904A-D. For example, bridge circuit 902 may comprise a pair of diode arrays, such as a BAS40-04 diode array including a two Schottky diodes. Thus, in such an embodiment two diodes, 902A, 902B may be included in a first diode array and diodes 902C, 902D in a second diode array. A zener diode 906 may be included across outputs 908A, 908B of bridge circuit 902 as protection for the voltage regulator circuit 506 (FIG. 5). An example of a zener diode which may be used in at least some embodiments is a CMZ5919 having a nominal Zener voltage of 5.6 volts. Filter 504 may comprise one or more capacitors 910 shunted across outputs 908A, 908B. In the exemplary embodiment in FIG. 9, two capacitors 910A, 910B are used. The value of the capacitors 901A, 901B may be 22 microfarads, for example.

Figure 10:
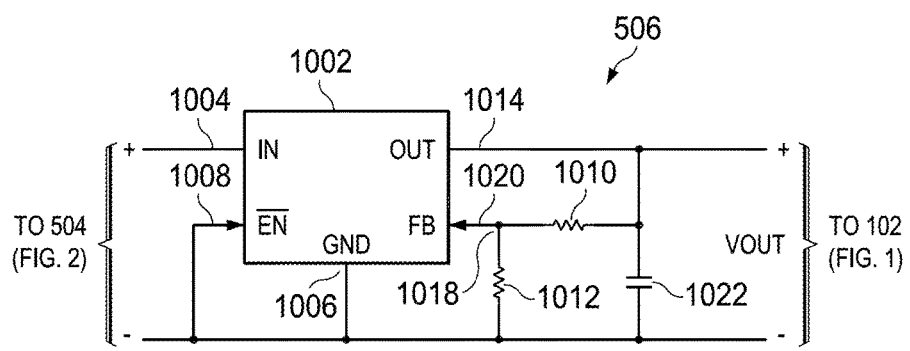
FIG. 10 shows a schematic drawing of a voltage regulator circuit in accordance with various examples.

FIG. 10 shows a schematic of an exemplary voltage regulator circuit 506 in accordance with at least some embodiments. Voltage regulator circuit 506 includes an regulator integrated circuit (IC) 1002 which may be a low dropout (LDO) device. An unregulated voltage from rectifier 502 (FIG. 5) is connected to regulator IC 1002; the positive polarity to input 1004, and the negative polarity to ground terminal 1006 of regulator 1002. To avoid doubt, it would be appreciated that in an isolated power supply 104 (FIG. 1) in accordance with the principles of the disclosure, the reference to a "ground" is a local, negative terminal of the supply, and not a global system ground. An active low enable input 1008 of regulator IC 1002 is also tied to ground terminal 1006 of regulator IC 1002. The output voltage, Vout, of regulator circuit 506 is set by a voltage divider including resistors 1010 and 1012 connected across output terminal 1014 if regulator IC 1002 and ground terminal 1006. The common node of the voltage divider 1018 is connected to the feedback terminal 1020 of regulator IC 1002. A capacitor 1022 is coupled across the output of regulator circuit 506 comprising terminals 1014 and 1006, to help stabilize an internal feedback loop within regulator IC1002. Exemplary values of the components included in oscillator voltage regulator 506 which may be used in at least some embodiments are listed in Table 3:

TABLE 3

| Reference Number | Component | Value |
| --- | --- | --- |
| 1002 | Regulator IC | TPS77001 |
| 1010 | Resistor | 174 Kilohm |
| 1012 | Resistor | 169 kilohm |
| 1022 | Capacitor | 10 microfarads |

The resistor values in table 3 are based on an exemplary output voltage $V_{out}$ of 2.5 volts. Other output voltages, as desired, may be obtained by adjusting the values of resistors 1010 and 1012 accordingly.

Figure 11:
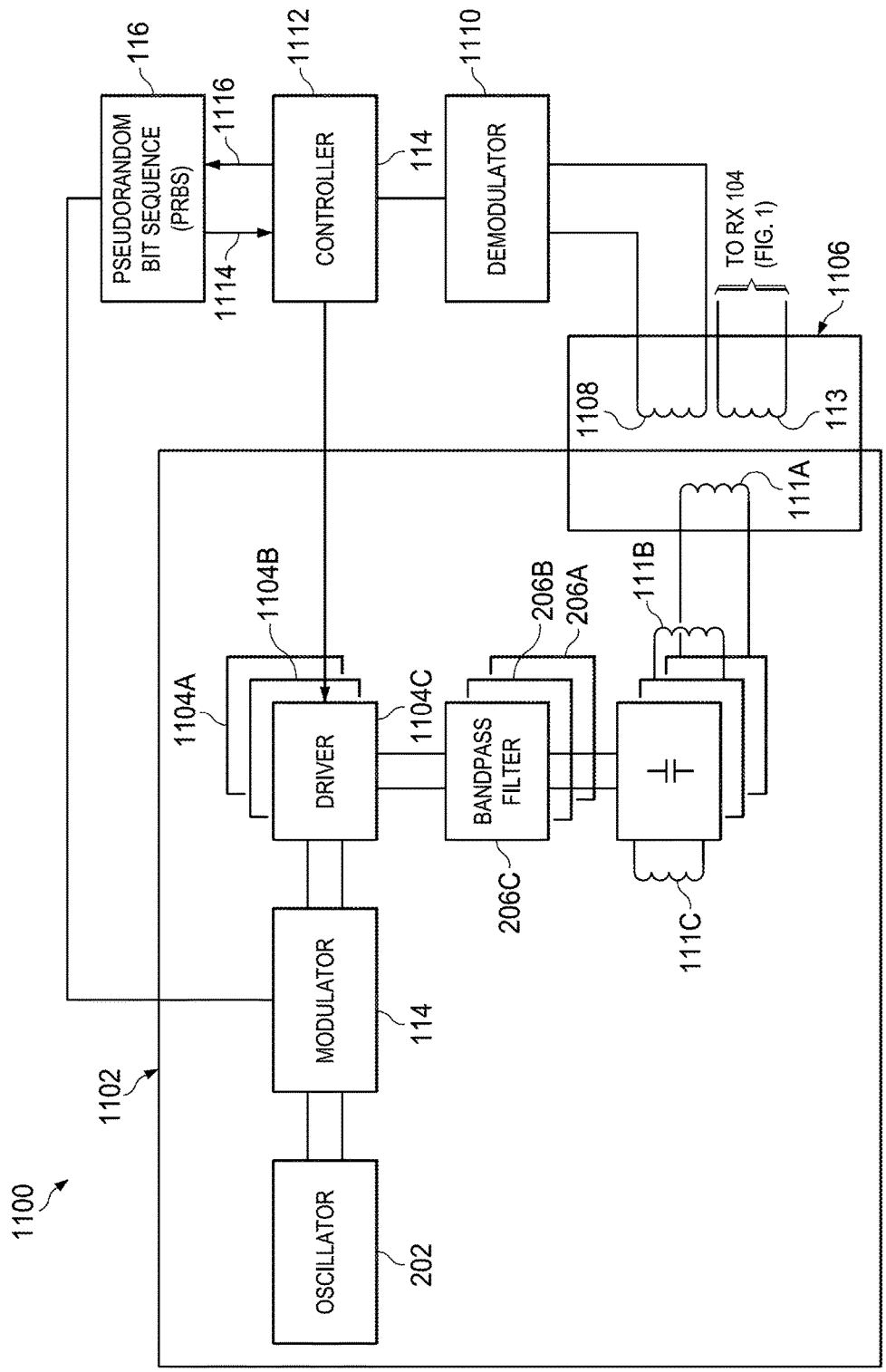
FIG. 11 shows a block diagram of a portion of a power meter circuit in accordance with various examples.

Turning now to FIG. 11, FIG. 11 shows a block diagram of a portion 1100 of a power meter circuit in accordance with at least some embodiments. Similar to power meter circuit 100 (FIG. 1), portion 1100 includes a power transmitter (TX) 1102. Like TX 106, TX 1102 includes an oscillator 202, and a modulator 114. TX1102 also includes drivers 1104A-C, which may be similar to drivers 204. Drivers 1104 may be controlled so as to vary the RF power output therefrom in response to a feedback control signal, as described further below. RF power from TX 1102 may be transformer-coupled to a power receiver (not shown in FIG. 11) as described above in conjunction with FIG. 1, for example. Similar to a transformer 110 (FIG. 1), transformer 1106 includes a primary coil 111 and a secondary coil 113 which is coupled to an RX 108 (not shown in FIG. 11). Transformer 1106 may also include a tertiary coil 1108 that samples the RF energy output from TX 1102. The sampled RF is coupled to a demodulator 1110 and the modulation recovered therefrom. The recovered modulation should match the modulating pseudorandom bit sequence. If, however, a jammer has managed to interfere with the RF received at RX 104 (not shown n FIG. 11), then at least some portion of the modulation recovered from the sampled RF energy would be expected to be corrupted, even if the jammer was not successful in starving the receiver completely. Thus, the recovered modulation may be input to a controller 1112 that also receives the modulating pseudorandom bit sequence 1114 from PRBS generator 116. The controller 1112 may then compare the recovered modulation and the modulating bit sequence 1114. If a a mismatch between the recovered modulation and the modulating bit sequence is detected, controller 1112 may then, for example, reseed the PRB S generator 116 with a new random seed 1116 different than a first seed. Alternatively or additionally, the controller 1112 may signal the drivers 1104A-C to increase their power to may operate to reduce the effectiveness of the jamming signal.

Figure 12:
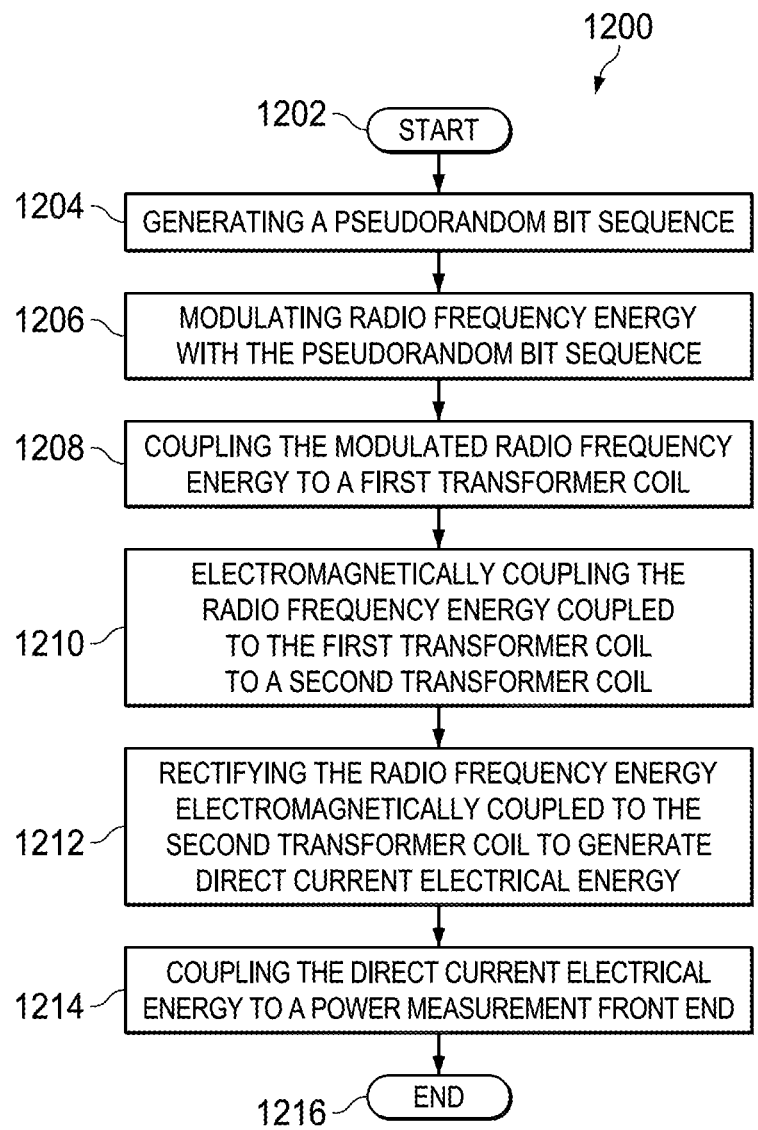
FIG. 12 shows a flow chart of a method and in accordance with various examples.

Turning now to FIG. 12, there is shown a flowchart of a method 1200 in accordance with at least some embodiments. Method 1200 starts at block 1202. In block 1204, a pseudorandom bit sequence is generated. For example, a pseudorandom bit stream may be generated with a linear feedback shift register seeded with a random number initial seed. Radio frequency energy is modulated with the pseudorandom bit sequence, at block 1206. Radio frequency energy may be generated using any suitable oscillator coupled to a phase or, alternatively, a frequency modulator. In block 1208, the modulated radio frequency energy is coupled to a first transformer coil, and the radio frequency energy coupled to the first transformer coil is electromagnetically coupled to a second transformer coil, block 1210. In block 1212, the radio frequency energy electromagnetically coupled to the second transformer coil is rectified to generate direct current electrical energy, and in block 1214, the direct current electrical energy is coupled to a power measurement front end. Method 1200 ends at block 1216.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An isolated power supply, comprising:
 a first transformer coil;
 a second transformer coil, the second transformer coil electromagnetically coupled to the first transformer coil;
 a transmitter coupled to the first transformer coil, the transmitter comprising:
  an oscillator configured to generate source radio frequency (RF) energy; and
  a modulator coupled to the oscillator, wherein the modulator is configured to:
   modulate the source RF energy based on a modulating signal comprising a pseudorandom bit sequence, to generate modulated RF energy; and
   couple the modulated RF energy to the first transformer coil; and
 a power receiver coupled to the second transformer coil.

2. The isolated power supply of claim 1, further comprising a pseudorandom bit sequence generator coupled to the modulator.

3. The isolated power supply of claim 1, wherein the first transformer coil is disposed on a first side of a printed circuit board and the second transformer coil is disposed on a second side of the printed circuit board opposite the first side.

4. The isolated power supply of claim 3, wherein:
the first transformer coil comprises a first spiral pattern etched in a first conductive layer disposed on the first side of the printed circuit board; and
the second transformer coil comprises a second spiral pattern etched in a second conductive layer disposed on the second side of the printed circuit board.

5. The isolated power supply of claim 4, wherein the first conductive layer and the second conductive layer form a galvanic isolation barrier without having a via therebetween.

6. The isolated power supply of claim 5, wherein each end of the first spiral pattern and the second spiral pattern are coupled to other circuit portions without the use of holes penetrating the galvanic isolation barrier.

7. The isolated power supply of claim 1, wherein the power receiver comprises:
a rectifier; and
a voltage regulator circuit coupled to an output of the rectifier.

8. The isolated power supply of claim 2, further comprising:
a third transformer coil, the third transformer coil electromagnetically coupled to the first transformer coil;
a demodulator coupled to the third transformer coil, the demodulator configured to recover a modulation from the RF energy; and
a controller coupled to the demodulator, the controller configured to compare a bit sequence from the recovered modulation and the modulating signal.

9. The isolated power supply of claim 8, wherein the controller, in response to determining that the bit sequence from the recovered modulation does not match the modulating signal, the controller is configured to:
increase an RF power of the RF energy; or
reseed the pseudorandom bit sequence generator with a second seed different than a first seed.

10. A method comprising:
generating, by a pseudorandom bit sequence generator, a pseudorandom bit sequence;
modulating, by a modulator, radio frequency (RF) energy with the pseudorandom bit sequence;
coupling the modulated RF energy to a first transformer coil;
electromagnetically coupling the modulated RF energy from the first transformer coil to a second transformer coil;
rectifying the RF energy electromagnetically coupled to the second transformer coil, to generate direct current electrical energy; and
coupling the direct current electrical energy to a power measurement front end.

11. The method of claim 10, wherein the first transformer coil is disposed on a first side of a printed circuit board, and the second transformer coil is disposed on a second side of the printed circuit board opposite the first side, and wherein the first side and the second side of the printed circuit board have no vias therebetween.

12. The method of claim 10, further comprising:
generating the RF energy by an oscillator;
coupling an output of the oscillator to the modulator;
amplifying a power of the RF energy in a driver coupled to an output of the modulator; and
coupling the output of the driver to the first transformer coil.

13. The method of claim 10, further comprising:
sampling the modulated RF energy by a second secondary transformer coil;
demodulating the sampled modulated RF energy, to recover a modulation from the sampled RF energy; and
comparing the recovered modulation and the pseudorandom bit sequence.

14. The method of claim 13, further comprising:
increasing a power of the RF energy, in response to determining that the pseudorandom bit sequence does not match the recovered modulation; or
reseeding the pseudorandom bit sequence generator with a second seed different than a first seed, in response to determining that the pseudorandom bit sequence does not match the recovered modulation.

15. The method of claim 10, wherein generating the pseudorandom bit sequence comprises:
seeding a linear feedback shift register with a random number; and
coupling an output of the linear feedback shift register to an input of the modulator.

16. A system comprising:
a power measurement front end; and
an isolated power supply coupled to the power measurement front end, the isolated power supply comprising:
a radio frequency (RF) power transmitter coupled to a first transformer coil of a transformer;
a power receiver coupled to a second transformer coil of the transformer, the second transformer coil electromagnetically coupled to the first transformer coil, an output of the power receiver coupled to the power measurement front end; and wherein:
the RF power transmitter generates RF energy having a modulation by a modulating signal comprising a pseudorandom bit sequence.

17. The system of claim 16, wherein:
the first transformer coil comprises a first spiral pattern etched in a first conductive layer disposed on a first side of a printed circuit board; and
the second transformer coil comprises a second spiral pattern etched in a second conductive layer disposed on a second side of the printed circuit board, the second side opposite the first side.

18. The system of claim 17, wherein the first conductive layer and the second conductive layer form a galvanic isolation barrier without having a via therebetween.

19. The system of claim 16, further comprising:
a third transformer coil, the third transformer coil electromagnetically coupled to the first transformer coil;
a demodulator coupled to the third transformer coil, the demodulator configured to recover a modulation from the RF energy; and
a controller coupled to the demodulator, the controller configured to compare a bit sequence from the recovered modulation and the modulating signal, wherein:
the controller, in response to determining that the bit sequence from the recovered modulation does not match the modulating signal, the controller is configured to:
increase an RF power of the RF power generator; or
reseed a pseudorandom bit sequence generator with a second seed different than a first seed.

20. The system of claim 16, wherein the modulation is selected from the group consisting of:
a frequency modulation; and
a phase modulation.

* * * * *